United States Patent
Zhang et al.

(10) Patent No.: US 10,053,779 B2
(45) Date of Patent: Aug. 21, 2018

(54) COATING PROCESS FOR APPLYING A BIFURCATED COATING

(71) Applicant: GENERAL ELECTRIC COMPANY, Schenectady, NY (US)

(72) Inventors: Liming Zhang, Greer, SC (US); Christopher Edward Thompson, Greenville, SC (US); Limin Wang, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 119 days.

(21) Appl. No.: 15/189,854

(22) Filed: Jun. 22, 2016

(65) Prior Publication Data

US 2017/0370002 A1    Dec. 28, 2017

(51) Int. Cl.
*B05D 3/02*    (2006.01)
*C23C 16/56*   (2006.01)
(Continued)

(52) U.S. Cl.
CPC .............. *C23C 16/56* (2013.01); *C23C 10/02* (2013.01); *C23C 10/04* (2013.01); *C23C 10/30* (2013.01);
(Continued)

(58) Field of Classification Search
CPC ..................................................... C23C 16/56
(Continued)

(56) References Cited

U.S. PATENT DOCUMENTS

| 2,685,543 | A |   | 8/1954  | Sindeband |
|-----------|---|---|---------|-----------|
| 3,544,348 | A | * | 12/1970 | Boone ..................... C23C 10/48 427/142 |

(Continued)

FOREIGN PATENT DOCUMENTS

| JP | 5696067 A  | 8/1981 |
|----|------------|--------|
| JP | 63190158 A | 8/1988 |

(Continued)

OTHER PUBLICATIONS

G.W. Goward; "Progress in coatings for gas turbine airfoils," Surface and Coatings Technology, Oct. 10, 1998, vol. 108-109, pp. 73-79.

(Continued)

*Primary Examiner* — Tabatha Penny
(74) *Attorney, Agent, or Firm* — McNees Wallace & Nurick LLC

(57) ABSTRACT

A coating process for applying a bifurcated coating to an article is disclosed including applying an aluminizing slurry to a first portion of the article, applying a chromizing slurry to a second portion of the article, and simultaneously heat treating the article, the aluminizing slurry, and the chromizing slurry. Heat treating the aluminizing slurry forms an aluminide coating on the first portion of the article and an aluminide diffusion zone between the article and the aluminide coating. Heat treating the chromizing slurry forms a chromide coating on the second portion of the article and a chromide diffusion zone between the article and the chromide coating. The first portion and the second portion are both maintained in an unmasked state while applying the aluminizing slurry and the chromizing slurry and during the heat treating.

20 Claims, 1 Drawing Sheet

(51) Int. Cl.
*C23C 10/02* (2006.01)
*C23C 10/04* (2006.01)
*C23C 10/30* (2006.01)
*C23C 10/32* (2006.01)
*C23C 10/48* (2006.01)
*C23C 10/60* (2006.01)
*F01D 5/28* (2006.01)

(52) U.S. Cl.
CPC ............... *C23C 10/32* (2013.01); *C23C 10/48* (2013.01); *C23C 10/60* (2013.01); *F01D 5/288* (2013.01)

(58) Field of Classification Search
USPC ........................................................ 427/376.2
See application file for complete search history.

(56) References Cited

U.S. PATENT DOCUMENTS

| | | | |
|---|---|---|---|
| 3,741,791 | A | 6/1973 | Maxwell et al. |
| 3,867,266 | A | 2/1975 | Miyata et al. |
| 3,903,338 | A | 9/1975 | Cook et al. |
| RE29,212 | E | 5/1977 | Baldi et al. |
| 5,217,757 | A | 6/1993 | Milaniak et al. |
| 5,366,765 | A | 11/1994 | Milaniak et al. |
| 6,022,632 | A | 2/2000 | Olson et al. |
| 6,110,262 | A | 8/2000 | Kircher et al. |
| 6,296,705 | B1 | 10/2001 | Ireland et al. |
| 6,444,054 | B1 | 9/2002 | Kircher et al. |
| 6,706,325 | B2 | 3/2004 | Spitsberg et al. |
| 6,730,179 | B2 | 5/2004 | Kircher |
| 7,150,926 | B2 | 12/2006 | Strangman |
| 7,597,966 | B2 | 10/2009 | Spitsberg et al. |
| 8,124,426 | B2 | 2/2012 | Gaidis |
| 8,262,812 | B2 | 9/2012 | Helmick et al. |
| 8,596,985 | B2 | 12/2013 | Walker et al. |
| 8,741,381 | B2 | 6/2014 | Zhang et al. |
| 8,916,005 | B2 | 12/2014 | Cavanaugh et al. |
| 8,973,808 | B2 | 3/2015 | Lin et al. |
| 2004/0115355 | A1 | 6/2004 | Bauer et al. |
| 2005/0014010 | A1 | 1/2005 | Dumm et al. |
| 2005/0031877 | A1 | 2/2005 | Gigliotti, Jr. et al. |
| 2006/0141283 | A1 | 6/2006 | Madhava |
| 2007/0009660 | A1 | 1/2007 | Sasaki et al. |
| 2009/0126833 | A1* | 5/2009 | Cavanaugh ............ C23C 10/20 148/248 |
| 2010/0151125 | A1 | 6/2010 | Kool et al. |
| 2011/0058591 | A1 | 3/2011 | Lim et al. |
| 2011/0058952 | A1 | 3/2011 | Pillhoefer et al. |
| 2012/0060721 | A1 | 3/2012 | Kool et al. |
| 2012/0324902 | A1 | 12/2012 | Pope et al. |
| 2013/0004712 | A1 | 1/2013 | Belov |
| 2013/0175325 | A1 | 7/2013 | Lin et al. |
| 2014/0044938 | A1 | 2/2014 | Pillhoefer et al. |
| 2014/0044986 | A1 | 2/2014 | Pillhoefer et al. |
| 2015/0197841 | A1* | 7/2015 | Tang ...................... C23C 10/20 427/252 |
| 2015/0197842 | A1* | 7/2015 | Tang ...................... C23C 10/20 428/666 |

FOREIGN PATENT DOCUMENTS

| | | |
|---|---|---|
| JP | 2003183809 A | 7/2003 |
| JP | 2006199988 A | 8/2006 |
| WO | 2010/134918 A1 | 11/2010 |
| WO | 2015/047783 A1 | 4/2015 |

OTHER PUBLICATIONS

Zhu et al.; "Oxidation of a Novel Chromium Coating with CeO2 Dispersions," Oxidation of Metals, Dec. 2004, vol. 62, Issue 516, pp. 411-426.
Cao, et al.; "A Novel Duplex Low-temperature Chromizing Process at 500 degrees C," J. Mater Sci. Technol., vol. 23, No. 6, 2007, pp. 823-827.
Cao, et al.; Phase transformations in low-temperature chromized 0.45 wt. per cent C plain carbon steel, Surface and Coatings Technology, vol. 201, 2007, pp. 7970-7977.
Sikalidis, ed., Advances in Ceramics—Synthesis and Characterization, Processing and Specific Applications, Chapter 4 by Kimura entitled "Molten Salt Synthesis of Ceramic Powders", Aug. 2001, pp. 75-100.
Leferink, et al.; "Chromium Diffusion Coatings on Low-Alloyed Steels for Corrosion Protection Under Sulphidizing Conditions," VGB Kraftwerkstechnik, vol. 73, No. 3, 1993, pp. 1-14.
Kool, et al.; "Chromide Coatings, Articles Coated with Chromide Coatings, and Processes for Forming Chromide Coatings," filed on Dec. 30, 2014 as U.S. Appl. No. 14/585,890 (not yet published).
APV Engineered Coatings, Safety Data Sheet for S-0099-01, date prepared Sep. 17, 2015, pp. 1-8, Akron.
Wang, et al.; "Diffusion Coatings for Metal-Based Substrate and Methods of Preparation Thereof", filed on Jun. 24, 2015 as U.S. Appl. No. 14/749,096 (not yet published).
International Search Report and Written Opinion issued in connection with corresponding PCT Application No. PCT/US2017/030487 dated Sep. 13, 2017.

* cited by examiner

COATING PROCESS FOR APPLYING A BIFURCATED COATING

FIELD OF THE INVENTION

The present invention is directed to coating processes for applying a bifurcated coating to an article. More particularly, the present invention is directed to applying a bifurcated coating to an article including an aluminide coating and a chromide coating.

BACKGROUND OF THE INVENTION

Gas turbines include components, such as buckets (blades), nozzles (vanes), combustors, shrouds, and other hot gas path components which are coated to protect the components from the extreme temperatures, chemical environments and physical conditions found within the gas turbines. Different coating systems may be applied to different locations of the same turbine components to meet the local conditions which vary across the turbine components.

In one example, the airfoil and shank of a turbine bucket (blade) experience different conditions, and whereas the airfoil may be subjected to conditions which lead to oxidation, the shank may be more susceptible to conditions which lead to pitting. Providing coatings to address oxidative conditions and pitting conditions typically requires multiple coating processes which lead to long coating cycles, multi-step masking procedures, and sequential furnace runs, particularly in instances where the separate coating systems are incompatible with one another.

BRIEF DESCRIPTION OF THE INVENTION

In an exemplary embodiment, a coating process for applying a bifurcated coating to an article includes applying an aluminizing slurry to a first portion of the article, applying a chromizing slurry to a second portion of the article, and simultaneously heat treating the article, the aluminizing slurry, and the chromizing slurry. Heat treating the aluminizing slurry forms an aluminide coating on the first portion of the article and an aluminide diffusion zone between the article and the aluminide coating. Heat treating the chromizing slurry forms a chromide coating on the second portion of the article and a chromide diffusion zone between the article and the chromide coating. The first portion and the second portion are both maintained in an unmasked state while applying the aluminizing slurry and the chromizing slurry and during the heat treating.

Other features and advantages of the present invention will be apparent from the following more detailed description of the preferred embodiment, taken in conjunction with the accompanying drawings, which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided are processes for applying a bifurcated coating to an article. Embodiments of the present disclosure, in comparison to processes not utilizing one or more features disclosed herein, decrease costs, increase process efficiency, decrease masking for each separated coating, decrease coating times, decrease furnace runs, increase production capacity, or a combination thereof.

Figure 1:
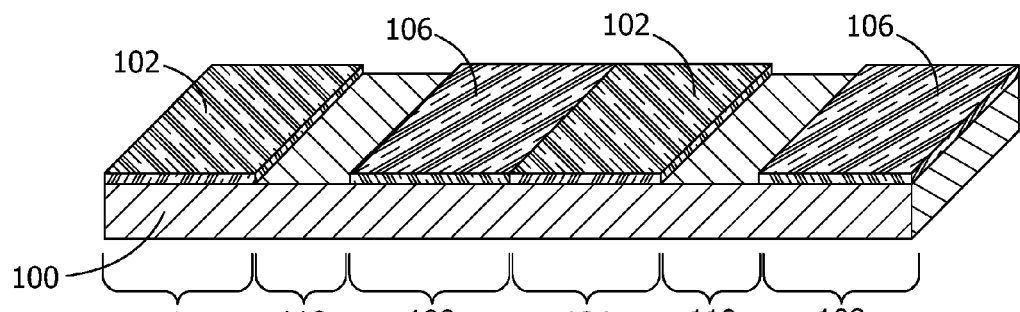
FIG. 1 is a schematic view of an article undergoing a coating process, according to an embodiment of the present disclosure.

Referring to FIG. 1, in one embodiment, a coating process includes applying an aluminizing slurry 102 to a first portion 104 of an article 100, applying a chromizing slurry 106 to a second portion 108 of the article 100, and simultaneously heat treating the article 100, the aluminizing slurry 102, and the chromizing slurry 106.

In a further embodiment, the coating process includes masking a third portion 110 of the article prior to the application of the aluminizing slurry 102 and the chromizing slurry 106. Any suitable masking process may be employed to prevent the third portion 110 from being coated by the aluminizing slurry 102 and the chromizing slurry 106.

The coating process may include a pre-coating cleaning prior to applying either of the aluminizing slurry 102 and the chromizing slurry 106. The cleaning may include any suitable cleaning process, including, but not limited to, steam cleaning, ultrasonic cleaning, solvent treatment, grit blasting, and combinations thereof.

Figure 2:
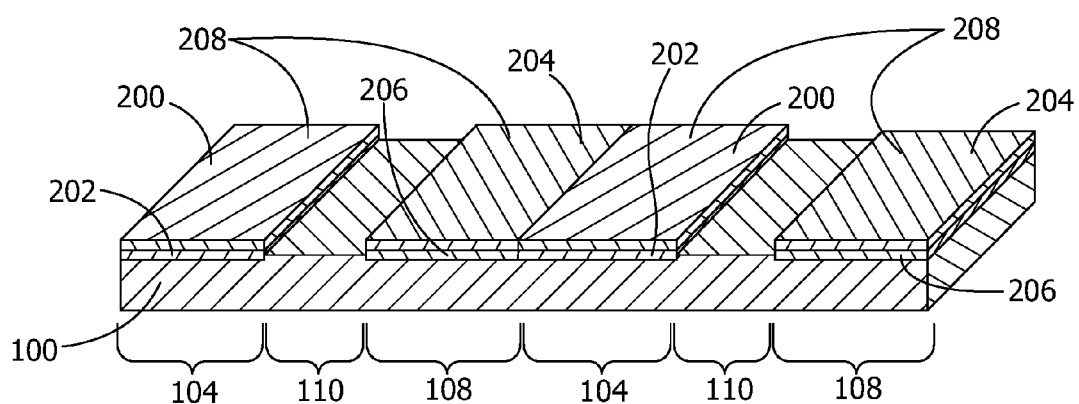
FIG. 2 is a schematic view of a coated article, according to an embodiment of the present disclosure.
Figure 3:
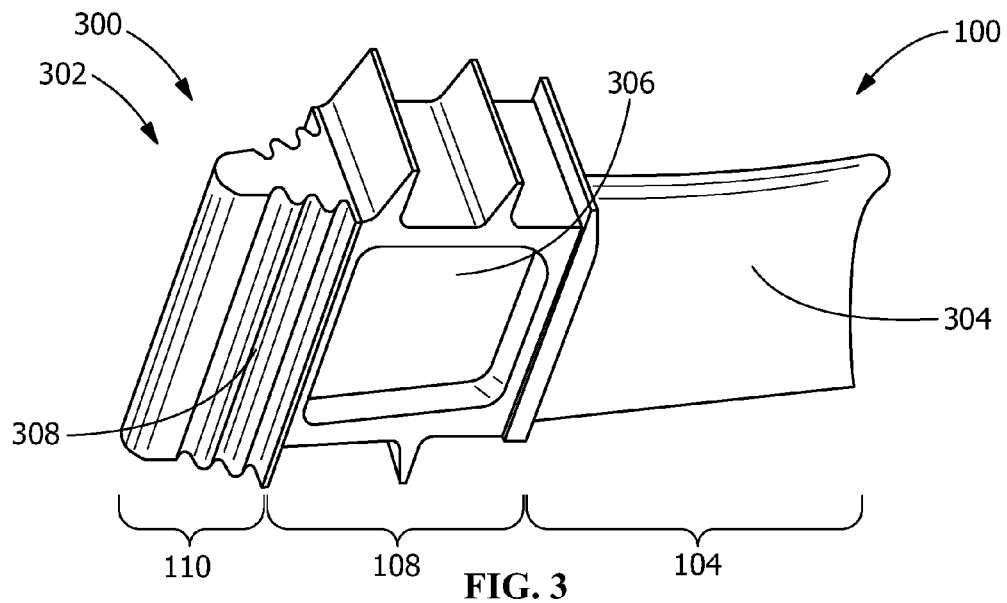
FIG. 3 is a perspective view of a coated turbine component, according to an embodiment of the present disclosure.

The first portion 104 may be a contiguous area (as shown in FIG. 3) or may include a plurality of isolated regions (as shown in FIGS. 1 and 2), the second portion 108 may be a contiguous area (as shown in FIG. 3) or may include a plurality of isolated regions (as shown in FIGS. 1 and 2), and if a third portion 110 is present, the third portion 110 may be a contiguous area (as shown in FIG. 3) or may include a plurality of isolated regions (as shown in FIGS. 1 and 2).

Referring again to FIG. 1, the aluminizing slurry 102 and the chromizing slurry 106 may be applied directly to any suitable surface, including, but not limited to, a metallic surface. In one embodiment, the aluminizing slurry 102 and the chromizing slurry 106 are applied directly to a substrate of the article 100. The substrate may be any suitable material, including, but not limited to an iron-based superalloy, a nickel-based superalloy, a cobalt-based superalloy, or a combination thereof. In another embodiment, the article 100 includes a bond coat, and the aluminizing slurry 102 and the chromizing slurry 106 are applied directly to the bond coat. The bond coat may be any suitable material, including, but not limited to a MCrAlY, an aluminide diffusion coating, or a combination thereof.

In one embodiment, the aluminizing slurry 102 includes a donor powder, an activator powder, and a binder, the donor powder including a metallic aluminum alloy having a melting temperature higher than aluminum, and the binder including at least one organic polymer gel. The aluminizing slurry 102 may include any suitable composition, including, but not limited to, a composition having, by weight, about 35 to about 65% of the donor powder, about 1 to about 25% of the activator powder, and about 25 to about 60% of the binder.

The donor powder of the aluminizing slurry 102 may include a metallic aluminum alloy having a melting temperature higher than aluminum (melting point of about 1,221° F.). In one embodiment, the donor powder includes metallic aluminum alloyed with chromium, iron, another aluminum alloying agent, or a combination thereof, provided that the alloying agent does not deposit during the diffusion aluminiding process, but instead serves as an inert carrier for the aluminum of the donor material. In a further embodiment, the donor powder includes a chromium-aluminum alloy such as, but not limited to, by weight, 44% aluminum, balance chromium and incidental impurities. In another embodiment, the donor powder has a particle size of up to 100 mesh (149 µm), alternatively up to −200 mesh (74 µm). Without being bound by theory, it is believed that the donor powder being a fine powder reduces the likelihood that the donor powder will be lodged or entrapped within the article 100.

The activator powder of the aluminizing slurry 102 may include any suitable material, including, but not limited to, ammonium chloride, ammonium fluoride, ammonium bromide, another halide activator or combinations thereof. Suitable materials for the activator powder react with aluminum in the donor material to form a volatile aluminum halide, such as, but not limited to, $AlCl_3$ or $AlF_3$, which reacts at the article 100 to deposit aluminum, which diffuses into the article 100.

The binder of the aluminizing slurry 102 may include at least one organic polymer gel. Suitable binders include, but are not limited to, a polymeric gel available under the name Vitta Braz-Binder Gel from the Vitta Corporation, and low molecular weight polyols such as polyvinyl alcohol. In one embodiment, the binder further includes a cure catalyst, an accelerant, or both, such as, but not limited to, sodium hypophosphite.

In one embodiment, the aluminizing slurry 102 is free of inert fillers and inorganic binders. The absence of inert fillers and inorganic binders prevents such materials from sintering and becoming entrapped in the article 100.

In one embodiment, the chromizing slurry 106 includes a donor powder, an inorganic salt having a melting point that is less than or equal to about 800° C., an activator, and a binder, wherein the donor powder includes chromium. The donor powder may include chromium in the form for chromium powder, and may further include an aluminum powder. In one embodiment, the chromium powder includes an additive such as aluminum, cobalt, nickel, silicon, or mixtures thereof. In another embodiment, if aluminum powder is present, the aluminum powder includes an additive such as cobalt, nickel, silicon, or mixtures thereof.

The chromizing slurry 106 includes donor powder particles having any suitable size, including, but not limited to, particles having a mean diameter of about 1 to about 10 microns (i.e., micrometers (µm)) as measured using a conventional particle size analyzer. The purity of the donor powder particles may be at least about 95% by weight, and in one embodiment is at least about 99% by weight.

The inorganic salt of the chromizing slurry 106 may be any suitable inorganic salt having a melting point that is less than or equal to about 800° C., including, but not limited to, KCl, LiF, LiCl, $CaCl_2$, $MgCl_2$, KOH, or combinations thereof. In one embodiment, the inorganic salt is a binary mixture of two inorganic salts. Typically, the salts in the binary mixture are in a well-mixed solid powder form. Such binary mixtures of two inorganic salts may include, but are not limited to, KCl—$BaCl_2$, NaCl—KCl, NaCl—$CaCl_2$, NaCl—$BaCl_2$, NaCl—$MgCl_2$, $MgCl_2$—$BaCl_2$, $MgCl_2$ $CaCl_2$, NaCl—$Na_2CO_3$, and mixtures thereof. The binary mixtures may have various molar ratios of the component salts. In one embodiment, the salt is KCl—$BaCl_2$ in a 0.555:0.445 molar ratio. In another embodiment, the salt is NaCl—$BaCl_2$ in a 0.6:0.4 molar ratio. The molar ratio of the salts in a binary mixture affects the melting point of the binary mixture. Accordingly, the molar ratio of the binary mixture may be controlled to select a melting point of the binary mixture that is less than or equal to about 800° C. In another embodiment, the inorganic salt is a ternary mixture of three inorganic salts. Typically, the salts in the ternary mixture are in a well-mixed solid powder form. Such ternary mixtures of two inorganic salts may include, but are not limited to, LiF—NaF—$MgF_2$, LiCl—KCl—$CaCl_2$, LiF—$PuF_3$—$ThF_4$, and mixtures thereof. The ternary mixtures may have various molar ratios of the component salts. As with the binary mixtures, the molar ratio of the salts in a ternary mixture affects the melting point of the ternary mixture. Accordingly, the melting point of the ternary mixture may be adjusted by altering the molar ration of the three salts so that the melting point is less than or equal to about 800° C.

The activator of the chromizing slurry 106 may be any suitable activator, including, but not limited to, ammonium halides, chromium halides, aluminum halides, and mixtures thereof. In one embodiment, the activator is $NH_4Cl$, $NH_4F$, $NH_4Br$, $CrCl_2$, $CrCl_3$, $AlCl_3$, or a combination thereof.

The binder of the chromizing slurry 106 may be any suitable binder which promotes cohesiveness of the chromizing slurry 106 and which decomposes when exposed to a predetermined temperature. In one embodiment, the predetermined temperature is a temperature within the range from about 600° C. to about 1300° C., alternatively the temperature range from about 800° C. to about 950° C. The binder may imbue the chromizing slurry 106 with the physical properties of a paste or a viscous liquid at room temperature. The binder may include one component or a combination of components. In one embodiment, the binder is a waterborne acrylic resin based binder, at least one organofunctional silane based binder, at least one cellulose-derived water-soluble polymer based binder, at least one polyvinyl alcohol based binder, at least one epoxy resin based binder, at least one alcohol soluble resin based binder, or a combination thereof. In a further embodiment, the binder is "BINDER B-200", which is commercially available from APV Engineered Coatings. As used herein, "BINDER B-200" refers to a composition including, by weight, about 69% water, about 20% to about 30% ethanol, about 1% to about 5% polyvinyl alcohol, about 1% to about 5% isopropanol, and about 0.1% to about 1% 4-methyl-2-pentanone.

In one embodiment, the chromizing slurry 106 includes, by weight, about 1% to about 60% of the donor powder, about 1% to about 70% of the inorganic salt, about 1% to about 30% of the activator, and at least about 1% of the binder.

In another embodiment, the chromizing slurry 106 includes: a chromium powder; a binary mixture of two inorganic salts selected from the group consisting of KCl—$BaCl_2$, NaCl—KCl, NaCl—$CaCl_2$, NaCl—$BaCl_2$, NaCl—$MgCl_2$, $MgCl_2$—$BaCl_2$, $MgCl_2$ $CaCl_2$, NaCl—$Na_2CO_3$, and mixtures thereof, wherein the binary mixture has a melting point that is less than or equal to about 800° C.; an activator selected from the group consisting of $NH_4Cl$, $NH_4F$, $NH_4Br$, $CrCl_2$, $CrCl_3$, $AlCl_3$, and mixtures thereof; and a binder. In a further embodiment, the binary mixture of two inorganic salts is KCl—$BaCl_2$ and the activator is $NH_4Cl$. In an alternate further embodiment, the binary mixture of two inorganic salts is NaCl—$BaCl_2$ and the activator is $NH_4Cl$.

The aluminizing slurry 102 and the chromizing slurry 106 may be applied, independently, by any suitable application technique, including, but not limited to, high-velocity oxygen fuel deposition, vacuum plasma spray deposition, painting, and combinations thereof.

Referring to FIGS. 1 and 2, in one embodiment, heat treating the aluminizing slurry 102 (as shown in FIG. 1) forms an aluminide coating 200 (as shown in FIG. 2) on the first portion 104 of the article 100 and an aluminide diffusion zone 202 between the article 100 and the aluminide coating 200. Heat treating the chromizing slurry (as shown in FIG. 1) forms a chromide coating 204 (as shown in FIG. 2) on the second portion 108 of the article 100 and a chromide diffusion zone 206 between the article 100 and the chromide coating 204. The first portion 104 and the second portion 108 are both maintained in an unmasked state while applying the aluminizing slurry 102 and the chromizing slurry 106 and during the heat treating. The aluminide coating 200 and the chromide coating 204 define a bifurcated coating 208. Forming the aluminide coating 200 may include forming the aluminide coating 200 as an outward-type coating.

The heat treating of the article 100, the aluminizing slurry 102, and the chromizing slurry 106 may include any suitable temperature, including, but not limited to a temperature within a range of about 1,750° F. to about 2,100° F., alternatively between about 1,800° F. to about 2,075° F., alternatively between about 1,850° F. to about 2,050° F. In one embodiment, the heat treating of the article 100, the aluminizing slurry 102, and the chromizing slurry 106 includes heating the article 100, the aluminizing slurry 102, and the chromizing slurry 106 to a temperature which is at or above the solution temperature for the aluminizing slurry 102 and the chromizing slurry 106. The heat treatment may include any suitable duration, including, but not limited to a duration from about 2 hours to about 8 hours, alternatively between about 3 hours to about 7 hours, alternatively between about 4 hours to about 6 hours, alternatively between about 4.5 hours to about 5.5 hours, alternatively about 5 hours.

In one embodiment, heat treating the article 100, the aluminizing slurry 102, and the chromizing slurry 106 consists of a single furnace cycle. In a further embodiment, applying the bifurcated coating 208 to the article 100 further includes aging the aluminide coating 200, the aluminide diffusion zone 202, the chromide coating 204, and the chromide diffusion zone 206. As used herein, "aging" is distinct from a "furnace cycle" in that the aging process is carried out at a lower temperature than the furnace cycle, and may be conducted in a separate heating environment from the furnace of the furnace cycle.

In one embodiment, following application of the aluminizing slurry 102 and the chromizing slurry 106 to the article 100, the article 100 is placed immediately in a coating chamber to perform the diffusion process. The coating chamber is evacuated, and may be backfilled with an inert or vacuum (with partial pressure) atmosphere (such as argon or hydrogen, respectively). The temperature within the coating chamber is raised to a temperature sufficient to burn off the binder (e.g. about 300° F. to about 400° F.), with further heating being performed to attain the desired diffusion temperature, during which time the activator is decomposed, the aluminum halide is formed, and aluminum is deposited on the article 100, forming the bifurcated coating 208 having the aluminide coating 200, the aluminide diffusion zone 202, the chromide coating 204, and the chromide diffusion zone 206.

Heating the aluminizing slurry 102 and the chromizing slurry 106 may form a residue on the bifurcated coating 208. The bifurcated coating 208 may be subjected to a post-coating cleaning following the heat treating. The post-coating cleaning may include any suitable technique, including, but not limited to, directed forced gas flow, grit blasting, glass bean blasting, solvent treatment, ultrasonic treatment, and combinations thereof.

Referring to FIG. 3, the article 100 may be any suitable article, including, but not limited to a turbine component 300. Suitable turbine components include, but are not limited to, a hot gas path component, a bucket (blade) 302, a nozzle (vane), a shroud, a combustor, a combustion component, or a combination thereof. In one embodiment, wherein the turbine component 300 is a bucket (blade) 302, the first portion 104 is an airfoil 304, the second portion 108 is a shank 306, and the third portion 110 is a root 308.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A coating process for applying a bifurcated coating to an article, comprising:
applying an aluminizing slurry to a first portion of the article;
applying a chromizing slurry to a second portion of the article, the chromizing slurry including a chromizing activator powder, and the chromizing activator powder including a species selected from the group consisting of ammonium halides, $NH_4Cl$, $NH_4F$, $NH_4Br$, and combinations thereof; and
simultaneously heat treating the article, the aluminizing slurry, and the chromizing slurry, heat treating the aluminizing slurry forming an aluminide coating on the first portion of the article and an aluminide diffusion zone between the article and the aluminide coating, heat treating the chromizing slurry forming a chromide coating on the second portion of the article and a chromide diffusion zone between the article and the chromide coating,
wherein the first portion and the second portion are both maintained in an unmasked state while applying the aluminizing slurry and the chromizing slurry and during the heat treating.

2. The coating process of claim 1, further including a pre-coating cleaning prior to applying either of the aluminizing slurry and the chromizing slurry.

3. The coating process of claim 1, further including masking a third portion of the article.

4. The coating process of claim 1, further including aging the aluminide coating, the aluminide diffusion zone, the chromide coating, and the chromide diffusion zone.

5. The coating process of claim 1, further including a post-coating cleaning after the heat treating.

6. The coating process of claim 1, wherein heat treating the article, the aluminizing slurry, and the chromizing slurry consists of a single furnace cycle.

7. The coating process of claim 1, wherein the article is a turbine component.

8. The coating process of claim 7, wherein the turbine component is selected from the group consisting of a hot gas path component, a bucket (blade), a nozzle (vane), a shroud, a combustor, a combustion component, and combinations thereof.

9. The coating process of claim 8, wherein the turbine component is a bucket (blade), the first portion is an airfoil, and the second portion is a shank.

10. The coating process of claim 1, wherein the first portion includes a plurality of isolated regions.

11. The coating process of claim 1, wherein the second portion includes a plurality of isolated regions.

12. The coating process of claim 1, wherein the chromizing slurry further includes:
   a chromizing donor powder including chromium;
   a chromizing inorganic salt having a melting point that is less than or equal to about 800° C. which is selected from the group consisting of KCl, LiF, LiCl, CaCl$_2$, MgCl$_2$, KOH, KCl—BaCl$_2$, NaCl—KCl, NaCl—CaCl$_2$, NaCl—BaCl$_2$, NaCl—MgCl$_2$, MgCl$_2$—BaCl$_2$, MgCl$_2$ CaCl$_2$, NaCl—Na$_2$CO$_3$, LiF—NaF—MgF$_2$, LiCl—KCl—CaCl$_2$, LiF—PuF$_3$—ThF4, and combinations thereof; and
   a chromizing binder.

13. The coating process of claim 1, wherein the aluminizing slurry includes, by weight, about 35% to about 65% of a donor powder, about 1% to about 25% of an activator powder, and about 25% to about 60% of a binder, the donor powder including a metallic aluminum alloy having a melting temperature higher than aluminum, and the binder including at least one organic polymer gel.

14. The coating process of claim 13, wherein the donor powder includes a chromium-aluminum alloy.

15. The coating process of claim 13, wherein the donor powder has a particle size of up to 100 mesh.

16. The coating process of claim 13, wherein the activator powder is selected from the group consisting of ammonium chloride, ammonium fluoride, ammonium bromide, and combinations thereof.

17. The coating process of claim 13, wherein forming the aluminide coating includes forming the aluminide coating as an outward-type coating.

18. The coating process of claim 1, wherein heat treating the article, the aluminizing slurry, and the chromizing slurry includes a heat treating temperature within a range of about 1,750° F. to about 2,100° F.

19. The coating process of claim 1, wherein heat treating the article, the aluminizing slurry, and the chromizing slurry includes a duration of from about 2 hours to about 8 hours.

20. The coating process of claim 1, wherein applying the aluminizing slurry and the chromizing slurry includes a technique selected from the group consisting of high-velocity oxygen fuel, vacuum plasma spray, painting, and combinations thereof.

* * * * *